United States Patent [19]

Aichelmann, Jr. et al.

[11] 4,313,199
[45] Jan. 26, 1982

[54] RECIRCULATING LOOP MEMORY ARRAY FAULT LOCATOR

[75] Inventors: Frederick J. Aichelmann, Jr.; Bruce E. Bachman, both of Hopewell Junction, N.Y.

[73] Assignee: International Business Machines Corp., Armonk, N.Y.

[21] Appl. No.: 163,374

[22] Filed: Jun. 26, 1980

[51] Int. Cl.³ .............................................. G06F 11/16
[52] U.S. Cl. ........................................ 371/21; 371/25
[58] Field of Search ............................. 371/21, 25, 68

[56] References Cited

U.S. PATENT DOCUMENTS

| | | | |
|---|---|---|---|
| 3,614,609 | 10/1971 | Gledd et al. | 371/25 |
| 3,761,695 | 9/1973 | Eichelbarger | 371/25 |
| 3,783,254 | 1/1974 | Eichelbarger | 364/700 |
| 3,784,907 | 1/1974 | Eichelbarger | 371/62 |
| 3,982,111 | 9/1976 | Lerner et al. | 371/21 |
| 4,001,818 | 1/1977 | Radichel et al. | 371/25 |
| 4,038,648 | 7/1977 | Chesley | 371/21 |

*Primary Examiner*—Charles E. Atkinson
*Attorney, Agent, or Firm*—Robert J. Haase

[57] ABSTRACT

Apparatus is disclosed for quickly testing memory arrays of multiple recirculating loop memory elements and for locating faulty elements, if any, within designated subdivisions of said array. All loops are loaded with identical test bits. The loaded data is verified and faulty elements, if any, are located by means of a plurality of comparison AND gates. Each gate is connected to the output of a respective subdivision of the array elements and produces a first output signal when all such outputs are identical (on a serial bit-by-bit basis) and produces a second output signal when all said outputs are not identical. The output signals from the respective comparison AND gates are sensed in serial succession to locate the array subdivision containing any faulty elements.

7 Claims, 3 Drawing Figures ated to the present assignee discloses a technique for
RECIRCULATING LOOP MEMORY ARRAY FAULT LOCATOR

DESCRIPTION

BACKGROUND OF THE INVENTION

1. Field of the Invention

The present invention generally relates to means for testing the constituent recirculating type memory elements of certain computer memory arrays and, more particularly, to apparatus for quickly locating the subdivisions of said array.

2. Description of the Prior Art

Copending patent application Ser. No. 163,373 for Recirculating Loop Memory Array Tester, filed June 26, 1980, in the name of F. J. Aichelmann, Jr. and assigned to the present assignee discloses a technique for rapidly initializing and testing memory arrays of multiple CCD loops accessible via single input-output (I/O) pins. Briefly, the input data gate for each loop is modified to receive a bulk store input signal which, when present, allows the same data to be inputted simultaneously to all loops in parallel. All loops are loaded (initialized) with identical data in the same time required to load a single addressed loop. Where the loaded data is test data, the stored data is verified by the provision of a comparison gate. The comparison gate receives an output from each loop as the loop recirculates the stored data. The loop outputs are ANDED by the comparison gate to produce a data verification signal only in the event that all of the data received from each loop is identical to that from all other loops on a bit-by-bit basis. A distinctive signal also is generated in the event that any one or more loops is non-identical to the data bits from all other loops. However, the technique disclosed in the aforementioned patent application does not provide for the determination of the location(s) of the faulty bit(s).

SUMMARY OF THE INVENTION

In accordance with the present invention, the faulty bits received from the constituent recirculating type memory elements of memory arrays are quickly located within designated subdivisions or partitions of such arrays. All faulty bits are detected, independent of the number of the memory elements within the array, in substantially the time required to circulate the stored data bits once around the recirculating loop path of a single memory element.

All loop memory elements are initialized to a predetermined condition for testing purposes by the loading of all loops with the same test data. The stored data is verified by means of a number of comparison gates. Each comparison gate receives the outputs from a designated number of loops as each loop recirculates the stored data. The designated loop outputs are ANDED by the respective comparison gates to produce respective data verification signals only in the event that all of the data from each loop is identical with that from all other loops, applied to a given comparison gate, on a bit-by-bit basis.

A distinctive signal is generated by a given comparison gate in the event that any one or more bits of the data received from one or more of the loops associated with the given comparison gate is non-identical to the data bits from all other associated loops. The output signals produced by the comparison gates are sensed in serial succession to locate the array subdivision containing any faulty elements. In one embodiment of the invention, a latch is provided at the output of each comparison gate. Each latch is set by the aforementioned distinctive signal from the respective comparison gate to store the information that one or more bits are faulty from the loops associated with that comparison gate. The latches are then sensed at logic speeds. Thus, all of the faulty bits are located within designated subdivisions of the array in substantially the time required to circulate the stored data bits once around the recirculating loop path of a single memory element.

DESCRIPTION OF THE PREFERRED EMBODIMENT

Figure 1:
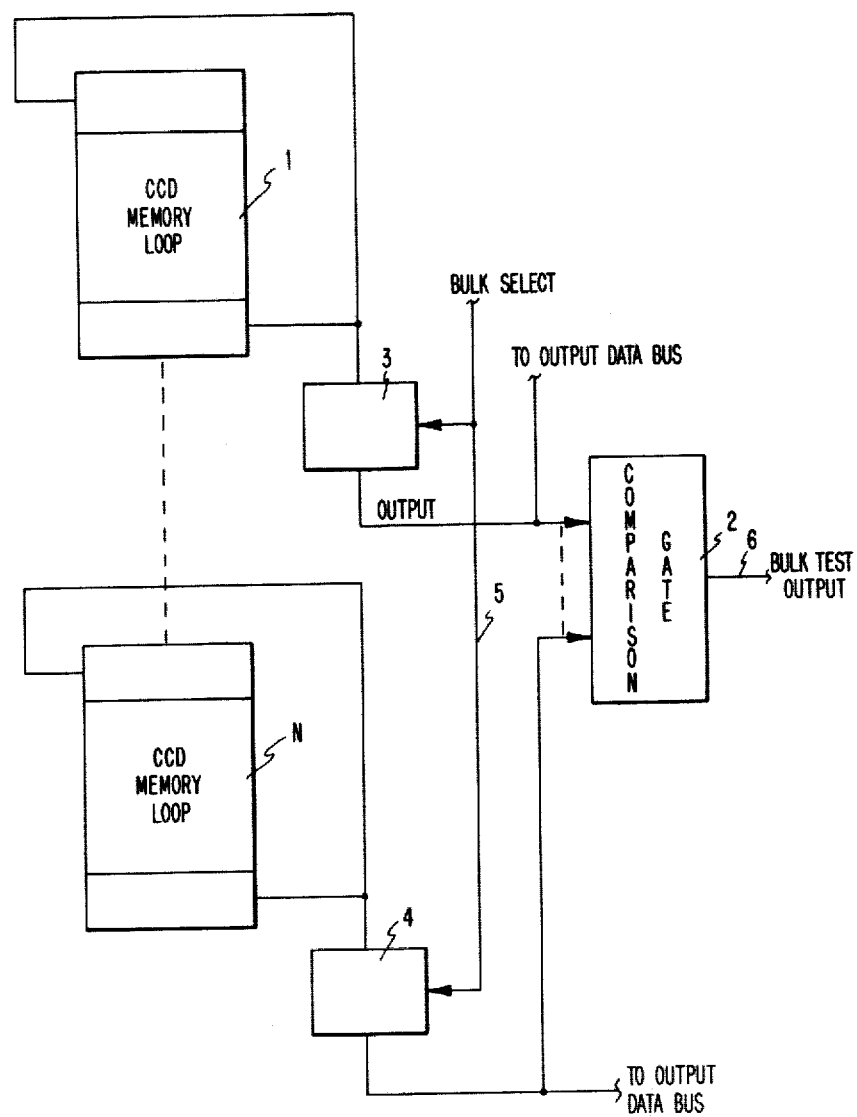
FIG. 1 is a simplified block diagram of a CCD memory array adapted for the verification of stored data.

The memory array of FIG. 1 comprises a multiplicity of recirculating CCD loops 1 through N which are individually addressable for writing and reading purposes assocated with the storage of digital data. The manner in which the loops 1 through N are addressed for data storage forms no part of the present invention and for that reason is not shown in the Figures. A description is given in the aforementioned copending patent application not only of the loading and reading operations for normal data storage purposes but also of the special bulk or parallel loading of all loops with identical data at the same time for the verification of the stored data. Either of those two loading techniques can be used in the present invention. Verification of the loaded data is accomplished by the provision of comparison gate 2 which simultaneously receives an output from each of the loops 1 through N as the loop recirculates the stored data. The loop outputs are ANDED by the comparison gate whenever the data output gates represented by gates 3 and 4 are rendered conductive by application of a bulk select signal to line 5.

The comparison gate 2 produces an output binary "one" signal on line 6 in the event that all of the input signals from the loops are identical on a bit-by-bit basis. In the event that all bits are not identical at any given time, gate 2 produces an output binary "zero" signal on line 6 signifying the occurrence of error in one or more of the CCD loops. It then becomes necessary to locate the source of the error.

Figure 2:
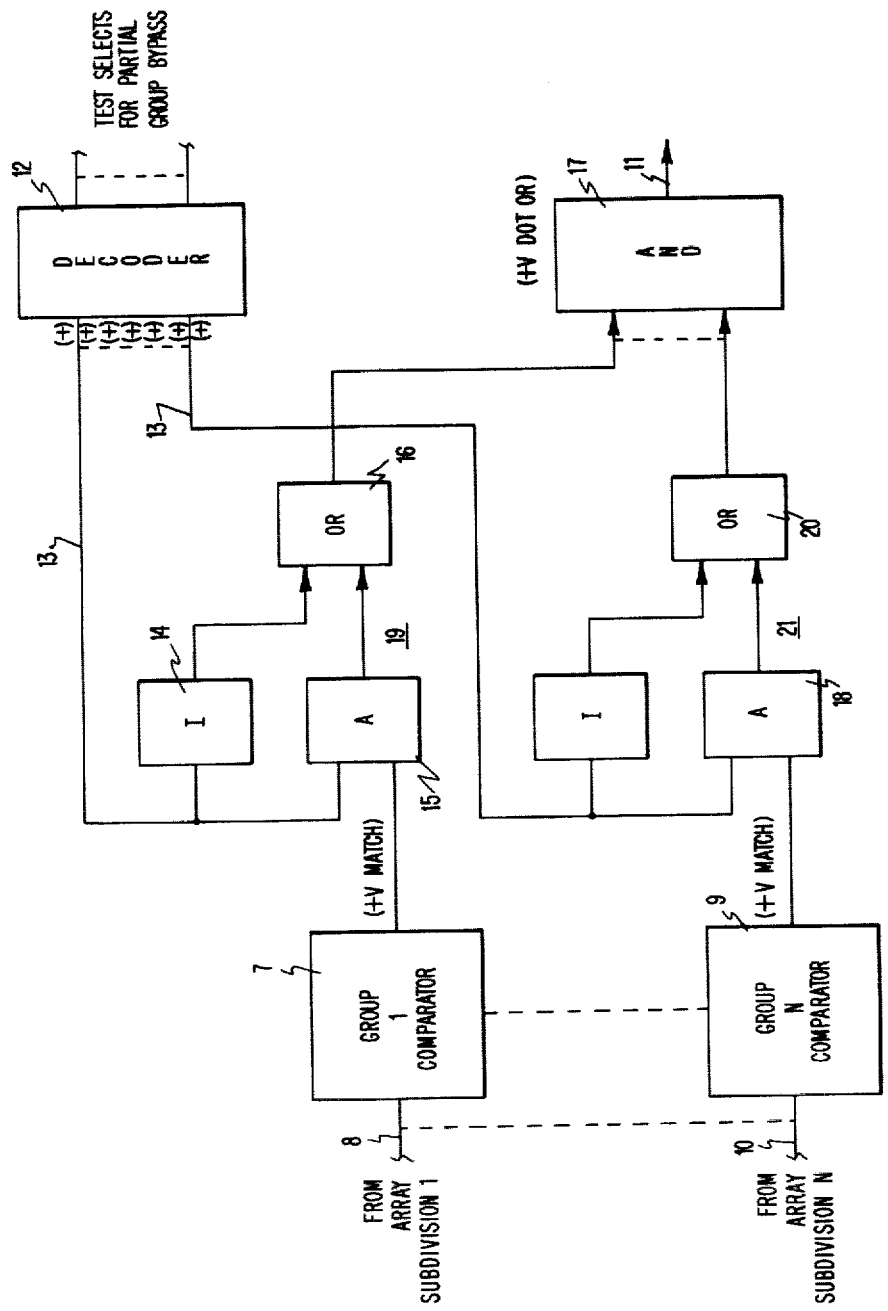
FIG. 2 is a simplified block diagram of the array of FIG. 1 modified for determining the location of faulty bits in accordance with the present invention.

In accordance with the present invention, the error can be localized within a designated subdivision or partition of the memory array by providing a plurality of comparison gates, one gate being allocated to each array subdivision or partition of memory loops. Such an arrangement is represented in FIG. 2. A first array subdivision of loops (group 1 of the constituent memory arrays) is connected to comparator by line 8. Similarly, the remaining array subdivisions of loops are connected to respective comparators in the corresponding manner that array subdivision N is connected to comparator 9 by line 10.

Two modes of operation are contemplated for the apparatus depicted in FIG. 2. In a first mode, all of the comparators are selected to provide a composite bulk test output signal on line 11. In the second mode, all but one of the comparators are selected. The second mode is utilized only if a binary "zero" signal is produced on output line 11, signifying the occurrence of error in one or more of the CCD loops, during a preceding first mode operation. In the second mode, the comparators are deselected in sequence until the error signal disappears on output line 11. The deselected comparator then designates the associated array subdivision of CCD loops in which the fault resides. The faulty array subdivision can be permanently deactivated by substitution of a replacement spare or by any other technique known in the art for recovery from a fault condition such as, for example, by reconfiguration or rearrangement of system devices to remove the faulty device from service.

If more than one subdivision or partition contain faulty loop or loops, it becomes necessary to deselect more than one comparator at a given time, in order to localize the faults to the respective subdivisions. Multiple deselection of comparators can be accomplished readily by the direct application of suitable signals to the individual lines 13 rather than through the use of a conventional decoder such as shown in FIG. 2.

Decoder 12 is arranged in a straightforward manner to produce a binary "one" signal on all but a selected one of its output lines 13 for second mode operation, or alternatively, on all of its output lines 13 for the first mode operation. Each of the output lines 13 is connected to a respective logic network typified by the network 19 comprising inverter 14, AND gate 15 and OR circuit 16 associated with array subdivision 1 comparator 7. The output from comparator 7 is coupled to AND gate 15 which also receives (along with inverter 14) the signal on the respective one of lines 13. The output from inverter 14 and AND gate 15 are applied to OR circuit 16. The outputs from all the logic network OR circuits are combined in bulk test AND circuit 17.

In operation, if no faulty bits occur in any of the array subdivisions during first mode operation, all of the AND gates (such as gates 15 and 18) produce a binary "one" output for each recirculating bit as it emerges from its memory loop and is applied to its respective group comparator. The binary "one" outputs from the AND gates 15 and 18 pass through OR circuits 16 and 20 and produce a binary "one" output on line 11 signifying no error.

On the other hand, if one or more faulty bits occur in any memory loop, a binary "zero" output is produced from the respective group comparator upon the occurrence of each such bit. The binary "zero", in effect, propagates through the associated logic circuit and through bulk test AND circuit 17 signifying error. To localize the error to the corresponding subdivision of the memory array, the second mode of operation of the apparatus of FIG. 2 is invoked. Decoder 12 now applies a binary "one" signal to all but a selected one of the logic circuits (e.g., 19 or 21) as the data bits in the memory loops continue to recirculate. If the faulty bit or bits have occurred in the selected array subdivision, the binary "zero" or zeros on output line 11 is replaced by corresponding binary "ones". The binary zero or zeros persist on line 11 if the faulty bits have occurred in other than the selected array subdivision whereupon it becomes necessary to iterate the process. A different array subdivision is selected during each iteration until the faulty bit subdivision is found by sensing the comparator outputs in serial succession. The replacement of the binary "zero" by a binary "one" takes place when the logic ciruit AND gate (e.g., 15) produces a binary "zero" output due to the presence of a faulty bit from the associated group compartor (e.g., 7) while the logic circuit inverter (e.g., 14) produces a binary "one" as a result of mode 2 operation wherein decoder 12 applies a binary "zero+ to the selected logic circuit (e.g., 19).

It can be seen that it is necessary to undergo a complete memory loop cycle each time that a different array subdivision is selected in order to localize the faulty bits. In accordance with the modification of the present invention shown in FIG. 3, however, the presence of faulty bits as well as their location within the corresponding subdivision of the array are determined in substantially the same single cycle of memory loop bit recirculation.

Figure 3:
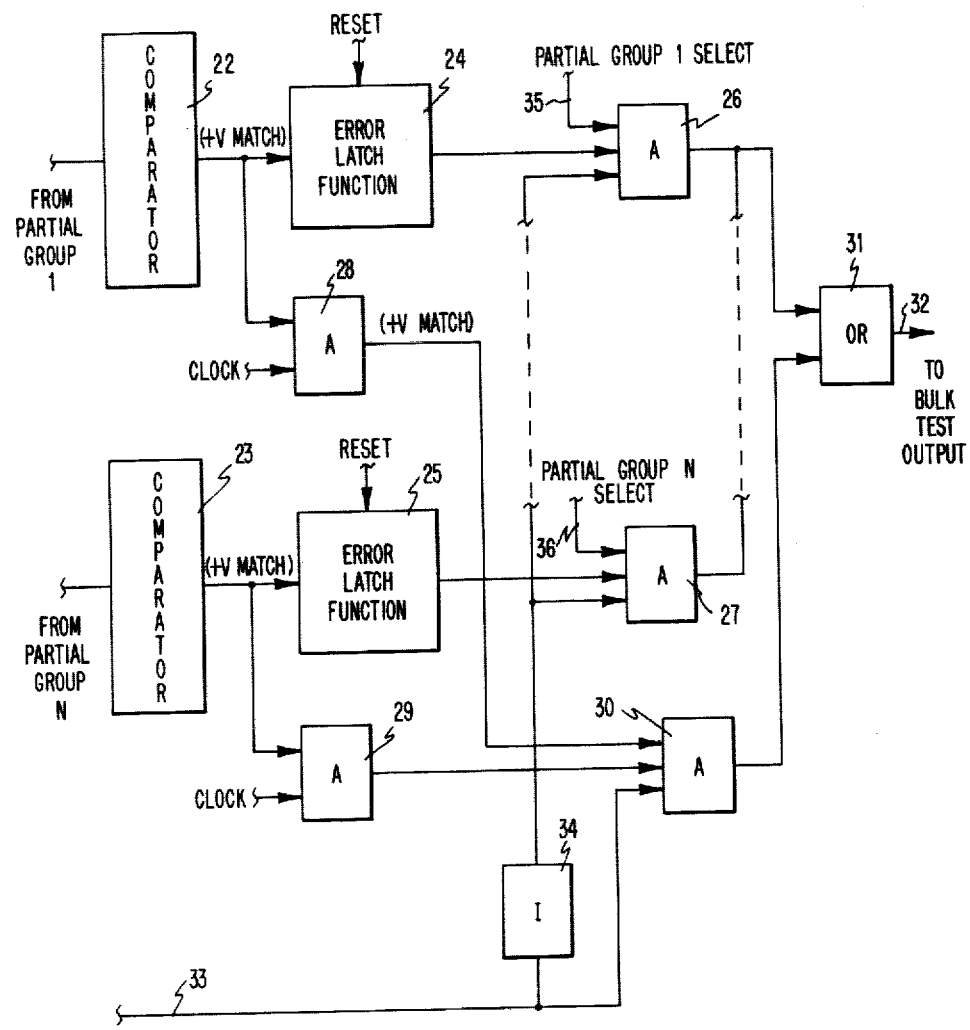
FIG. 3 shows a modification of the array of FIG. 2 to store the location of the faulty bits.

Referring to FIG. 3, group comparators perform the same function as previously described in connection with FIG. 2. The output from each comparator is split along two separate paths, a first path including an error latch, such as 24 and 25, and a group selection AND circuit, such as AND circuits 26 and 27, (for localizing faulty bits) and a second path comprising clocking AND circuits, such as AND circuits 28 and 29, and common bulk test AND circuit 30 (for determining the presence of faulty bits without regard to their location). The two paths merge via OR circuit 31 to provide a combined test output on line 32. AND circuit 30 receives the bulk test signal on line 33. Group selection AND circuits, such as 26 and 27, receive the bulk test signal through inverter 34. Thus, circuit 30 is conditioned for conduction during the bulk test mode whereas circuits 26 and 37 are conditioned for conduction at other times when it is desired to localize the faulty bits discovered during the bulk test mode.

The bulk test mode functions similarly as described in connection with FIG. 2 with AND circuits 28, 29 and 30 and OR circuit 31 producing binary "ones" on line 32 for each correct bit circulating in all memory loops. As before, all memory loops are loaded with identical bit data prior to the bulk test. In the event of a faulty bit or bits in any loop, a binary "zero" appears on line 32, during the bulk test mode, signifying that the faulty bit localizing mode must be invoked. However, with the provision of error latches such as 24 and 25, it is not necessary to recycle the memory loops in order to localize the faulty bits.

Each error latch is reset prior to the bulk test and then is set by the occurrence of a binary "zero" (indicating error) at the output of the respective comparator. Once set, the latches are sensed at logic speeds, substantially faster than the rate of recirculation of the memory loops, by a process of selection in which each of the AND circuits, such as circuits 26 and 37, are addressed in sequence by signals applied to lines 35 and 36. The appearance of a binary "zero" on line 32, during the faulty bit localizing mode, identifies the array subdivision containing the faulty bit as the one which corresponds to the AND circuit (26, 27) which is being addressed at the same time. It is not necessary to recycle all memory loops in order to localize the faulty bits as is the case with the apparatus of FIG. 2.

We claim:

1. Logic means on an array chip for testing the constituent recirculating loop memory elements of said array, said means comprising
   means for addressing all of said elements and for loading said elements with the same test bits a plurality of comparison gate means, each said comparison gate means being connected to the outputs of a respective subdivision of said array of elements for ANDing said outputs to produce a respective first output signal when all said outputs are identical on a serial bit-by-bit basis and to produce a respective second output signal when all said outputs are not identical, and means for sensing in serial succession the respective output signals from said plurality of comparison gate means.

2. The apparatus defined in claim 1 wherein said means for sensing the respective output signals from said plurality of comparison gate means operates at a serial succession rate commensurate with the rate of recirculation of said loop memory elements.

3. The apparatus defined in claim 1 wherein said means for sensing the respective output signals from said plurality of comparison gate means operates at a serial succession rate which is substantially faster than the rate of recirculation of said loop memory elements.

4. The apparatus defined in claim 1 wherein said elements are charge coupled devices.

5. The apparatus defined in claim 1 or claim 3 wherein said means for sensing the respective output signals from said plurality of comparison gate means comprises an equal plurality of error latches connected to receive respective ones of said output signals, and means for sensing said error latches in serial succession.

6. The apparatus defined in claim 1 and further including means for ANDing the output signals from all of said comparison gate means.

7. The apparatus in claim 1 wherein said means for addressing and for loading simultaneously addresses all of said elements and loads said elements in parallel with the same test bits.

* * * * *